(12) United States Patent
Lau et al.

(10) Patent No.: US 9,590,637 B1
(45) Date of Patent: Mar. 7, 2017

(54) HIGH-SPEED PROGRAMMABLE FREQUENCY DIVIDER WITH 50% OUTPUT DUTY CYCLE

(71) Applicant: Integrated Device Technology, Inc., San Jose, CA (US)

(72) Inventors: Pak-Kim Lau, Sunnyvale, CA (US); Min Chu, Milpitas, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/839,817

(22) Filed: Aug. 28, 2015

(51) Int. Cl.
| | | |
|---|---|---|
| H03K 21/00 | (2006.01) | |
| H03K 23/40 | (2006.01) | |
| H03K 23/66 | (2006.01) | |
| H03K 21/10 | (2006.01) | |

(52) U.S. Cl.
CPC ............. *H03K 23/40* (2013.01); *H03K 21/10* (2013.01); *H03K 23/66* (2013.01)

(58) Field of Classification Search
None
See application file for complete search history.

(56) References Cited

U.S. PATENT DOCUMENTS

| | | |
|---|---|---|
| 4,862,485 A | 8/1989 | Guinea et al. |
| 5,663,105 A | 9/1997 | Yu et al. |
| 5,748,949 A * | 5/1998 | Johnston ............... H03K 23/68 377/52 |
| 5,757,240 A | 5/1998 | Boerstler et al. |
| 5,903,195 A | 5/1999 | Lukes et al. |
| 6,219,797 B1 | 4/2001 | Liu et al. |
| 6,259,327 B1 | 7/2001 | Balistreri et al. |
| 6,640,311 B1 | 10/2003 | Knowles et al. |
| 6,643,787 B1 | 11/2003 | Zerbe et al. |
| 6,650,193 B2 | 11/2003 | Endo et al. |
| 6,683,506 B2 | 1/2004 | Ye et al. |

(Continued)

OTHER PUBLICATIONS

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

(Continued)

*Primary Examiner* — Long Nguyen
(74) *Attorney, Agent, or Firm* — Glass & Associates; Kenneth Glass (57) ABSTRACT

A frequency divider includes a multiplexer having a first input terminal coupled to receive a first value M and a second input terminal for receiving a second value that is M+LSB, the multiplexer is configured to alternately output the first value M and the second value. The frequency divider includes a multi-modulus divider coupled to the multiplexer for receiving the output of the multiplexer, the multi-modulus divider operable to alternately generate an output pulse at M input clock cycles and at M+LSB clock cycles. A divide-by-two counter having an input coupled to the output of the multi-modulus divider, is operable to divide the output of the multi-modulus divider to generate a divided clock signal having a frequency of N, where N is equal to 2M+LSB. Duty cycle correction logic is coupled to the output of the divide-by-two counter and is configured to correct the duty cycle of the divided clock signal to a fifty percent duty cycle when N is odd.

18 Claims, 5 Drawing Sheets

10

(56) References Cited

U.S. PATENT DOCUMENTS

| | | | |
|---|---|---|---|
| 6,727,767 B2 | 4/2004 | Takada et al. | |
| 6,768,387 B1 | 7/2004 | Masuda et al. | |
| 6,870,411 B2 | 3/2005 | Shibahara et al. | |
| 6,959,066 B2 * | 10/2005 | Wang | H03K 23/662 377/47 |
| 7,012,476 B2 | 3/2006 | Ogiso et al. | |
| 7,323,916 B1 | 1/2008 | Sidiropoulos et al. | |
| 7,405,594 B1 | 7/2008 | Xu, et al. | |
| 7,434,083 B1 | 10/2008 | Wilson, et al. | |
| 7,541,848 B1 | 6/2009 | Masuda et al. | |
| 7,545,188 B1 | 6/2009 | Xu et al. | |
| 7,573,303 B1 | 8/2009 | Chi et al. | |
| 7,586,347 B1 | 9/2009 | Ren et al. | |
| 7,590,163 B1 | 9/2009 | Miller et al. | |
| 7,671,635 B2 | 3/2010 | Fan et al. | |
| 7,737,739 B1 | 6/2010 | Bi et al. | |
| 7,741,981 B1 | 6/2010 | Wan et al. | |
| 7,750,618 B1 | 7/2010 | Fang et al. | |
| 7,786,763 B1 | 8/2010 | Bal et al. | |
| 7,816,959 B1 | 10/2010 | Isik et al. | |
| 7,907,625 B1 | 3/2011 | MacAdam et al. | |
| 7,928,880 B2 | 4/2011 | Tsukamoto | |
| 7,941,723 B1 | 5/2011 | Lien et al. | |
| 8,018,289 B1 | 9/2011 | Hu et al. | |
| 8,164,367 B1 | 4/2012 | Bal et al. | |
| 8,179,952 B2 | 5/2012 | Thurston et al. | |
| 8,188,796 B2 | 5/2012 | Zhu et al. | |
| 8,259,888 B2 | 9/2012 | Hua et al. | |
| 8,284,816 B1 | 10/2012 | Clementi et al. | |
| 8,305,154 B1 | 11/2012 | Kubena et al. | |
| 8,416,107 B1 | 4/2013 | Wan et al. | |
| 8,432,231 B2 | 4/2013 | Nelson et al. | |
| 8,436,677 B2 | 5/2013 | Kull et al. | |
| 8,456,155 B2 | 6/2013 | Tamura et al. | |
| 8,471,751 B2 | 6/2013 | Wang | |
| 8,537,952 B1 | 9/2013 | Arora et al. | |
| 8,693,557 B1 | 4/2014 | Zhang et al. | |
| 8,704,564 B2 | 4/2014 | Hasegawa et al. | |
| 8,723,573 B1 | 5/2014 | Wang et al. | |
| 8,791,763 B2 | 7/2014 | Taghivand | |
| 8,896,476 B2 | 11/2014 | Harpe | |
| 8,933,830 B1 | 1/2015 | Jeon | |
| 8,981,858 B1 | 3/2015 | Grivna et al. | |
| 9,077,386 B1 | 7/2015 | Holden et al. | |
| 9,100,232 B1 | 8/2015 | Hormati et al. | |
| 9,455,854 B2 | 9/2016 | Gao | |
| 2002/0079937 A1 | 6/2002 | Xanthopoulos et al. | |
| 2002/0191727 A1 | 12/2002 | Staszewski et al. | |
| 2003/0042985 A1 | 3/2003 | Shibahara et al. | |
| 2003/0184350 A1 * | 10/2003 | Wang | H03K 23/662 327/115 |
| 2004/0136440 A1 | 7/2004 | Miyata et al. | |
| 2004/0165691 A1 | 8/2004 | Rana et al. | |
| 2006/0103436 A1 | 5/2006 | Saitou et al. | |
| 2006/0119402 A1 | 6/2006 | Thomsen et al. | |
| 2006/0197614 A1 | 9/2006 | Roubadia et al. | |
| 2006/0290391 A1 | 12/2006 | Leung et al. | |
| 2007/0149144 A1 | 6/2007 | Beyer et al. | |
| 2007/0247248 A1 | 10/2007 | Kobayashi et al. | |
| 2008/0043893 A1 | 2/2008 | Nagaraj et al. | |
| 2008/0104435 A1 | 5/2008 | Pernia et al. | |
| 2008/0129351 A1 | 6/2008 | Chawla et al. | |
| 2008/0246546 A1 | 10/2008 | Ha et al. | |
| 2009/0083567 A1 | 3/2009 | Kim et al. | |
| 2009/0140896 A1 | 6/2009 | Adduci et al. | |
| 2009/0153252 A1 | 6/2009 | Chen et al. | |
| 2009/0184857 A1 | 7/2009 | Furuta et al. | |
| 2009/0231901 A1 | 9/2009 | Kim et al. | |
| 2009/0256601 A1 | 10/2009 | Zhang et al. | |
| 2009/0262567 A1 | 10/2009 | Shin et al. | |
| 2010/0007427 A1 | 1/2010 | Tomita et al. | |
| 2010/0052798 A1 | 3/2010 | Hirai et al. | |
| 2010/0090731 A1 | 4/2010 | Casagrande et al. | |
| 2010/0164761 A1 | 7/2010 | Wan et al. | |
| 2010/0194483 A1 | 8/2010 | Storaska et al. | |
| 2010/0240323 A1 | 9/2010 | Qiao et al. | |
| 2010/0323643 A1 | 12/2010 | Ridgers et al. | |
| 2011/0006936 A1 | 1/2011 | Lin et al. | |
| 2011/0032013 A1 | 2/2011 | Nelson et al. | |
| 2011/0095784 A1 | 4/2011 | Behel et al. | |
| 2011/0234204 A1 | 9/2011 | Tamura et al. | |
| 2011/0234433 A1 | 9/2011 | Aruga et al. | |
| 2011/0285575 A1 | 11/2011 | Landez et al. | |
| 2011/0304490 A1 | 12/2011 | Janakiraman | |
| 2012/0013406 A1 | 1/2012 | Zhu et al. | |
| 2012/0161829 A1 | 6/2012 | Fernald et al. | |
| 2012/0200330 A1 | 8/2012 | Kawagoe et al. | |
| 2012/0249207 A1 | 10/2012 | Natsume et al. | |
| 2012/0262315 A1 | 10/2012 | Kapusta et al. | |
| 2012/0297231 A1 | 11/2012 | Qawami et al. | |
| 2012/0317365 A1 | 12/2012 | Elhamias et al. | |
| 2012/0328052 A1 | 12/2012 | Etemadi et al. | |
| 2013/0002467 A1 | 1/2013 | Wang | |
| 2013/0162454 A1 | 6/2013 | Lin | |
| 2013/0194115 A1 | 8/2013 | Wu et al. | |
| 2013/0211758 A1 | 8/2013 | Prathapan et al. | |
| 2013/0300455 A1 | 11/2013 | Thirugnanam et al. | |
| 2014/0029646 A1 | 1/2014 | Foxcroft et al. | |
| 2014/0210532 A1 | 7/2014 | Jenkins et al. | |
| 2014/0327478 A1 | 11/2014 | Horng et al. | |
| 2014/0347941 A1 | 11/2014 | Jose et al. | |
| 2015/0162921 A1 | 6/2015 | Chen et al. | |
| 2015/0180594 A1 | 6/2015 | Chakraborty et al. | |
| 2015/0200649 A1 | 7/2015 | Trager et al. | |
| 2015/0213873 A1 | 7/2015 | Joo et al. | |
| 2016/0084895 A1 | 3/2016 | Imhof | |
| 2016/0119118 A1 | 4/2016 | Shokrollahi | |
| 2016/0162426 A1 | 6/2016 | Benjamin et al. | |
| 2016/0211929 A1 | 7/2016 | Holden et al. | |

OTHER PUBLICATIONS

"19-Output PCIE Gen 3 Buffer", Si53019-A01A, Silicon Laboratories Inc., Rev. 1.1 May 2015, 34 Pages.

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

* cited by examiner

HIGH-SPEED PROGRAMMABLE FREQUENCY DIVIDER WITH 50% OUTPUT DUTY CYCLE

BACKGROUND OF THE INVENTION

Programmable frequency dividers are widely deployed in applications such as clocking and frequency synthesis. Programmable frequency dividers have been developed that have a 50% duty cycle and that operate at relatively high clock speeds. However, there is a need for programmable frequency dividers that operate at even higher clock speeds. While programmable frequency dividers are relatively easy to design that either operate at high input frequencies (multi-GHZ) or that have 50% output duty cycle, it is difficult to design a programmable frequency divider that both operates at multi-GHZ clock frequencies and has a 50% duty cycle. This is especially true when the division ratio (divisor) is odd because the frequency divider must be able to count in half-cycles to achieve a 50% duty cycle. Frequency dividers that count in half cycles are more complex, use more die area, and require more power than frequency dividers that do not count in half-cycles.

Accordingly, there is a need for a programmable frequency divider that can operate at high input frequencies, that has a 50% output duty cycle and that does not have the complexity and power requirements of conventional frequency dividers that count in half cycles.

SUMMARY OF THE INVENTION

A frequency divider is disclosed that includes a multiplexer having a first input terminal coupled to receive a first value M and a second input terminal for receiving a second value that is M plus a least significant bit (LSB), the multiplexer configured to alternately output the first value M and the second value M+LSB. The frequency divider includes a multi-modulus divider coupled to the multiplexer for receiving the output of the multiplexer and has a clock input for receiving a clock signal. The multi-modulus divider is operable to alternately generate an output pulse at M input clock cycles and at M+LSB clock cycles. A divide-by-two counter having an input coupled to the output of the multi-modulus divider is operable to divide the output of the multi-modulus divider to generate a divided clock signal having a frequency of N, where N is equal to 2M+LSB. Duty cycle correction logic that is coupled to the output of the divide-by-two counter is configured to correct the duty cycle of the divided clock signal to a fifty percent duty cycle when N is odd.

A method for generating a divided clock signal having a 50% duty cycle is disclosed that includes alternately dividing an input clock signal by a divisor M and a divisor M plus a least significant bit (LSB) to alternate periodically between generating an output pulse at M input clock cycles and M+LSB input clock cycles. The generated output pulse is divided using the divide-by-two counter to generate a divided clock signal having a frequency of N. The duty cycle of the divided clock signal is corrected when the LSB is odd to generate a corrected divided clock signal having a fifty percent duty cycle.

The method and apparatus of the present invention provide a high-speed programmable frequency divider with a 50% duty cycle having a simplified architecture and reduced power consumption as compared to conventional programmable frequency dividers that require counting in half cycles.

DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
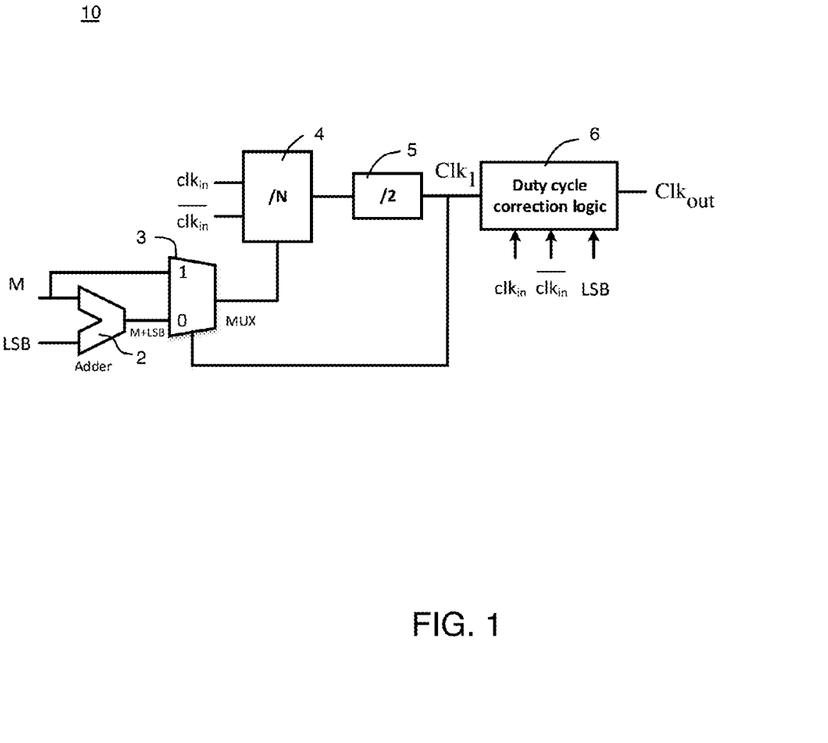
FIG. 1 is an illustration of a frequency divider in accordance with an embodiment of the present invention.

FIG. 1 shows a frequency divider 10 that divides by counting a total of N cycles of the input clock signal, where N is the divisor. Any integer can be written as N=2M+LSB. If N is an odd number, then LSB is 1 and if N is an even number the LSB is 0. N and M can be obtained in binary form without any logic operation as the LSB is the last (least significant) digit of N and M consists of the remaining digits. For example, if N=7, then N=2×3+1. In binary form N is bill, where the LSB is 1 and M is the left most two digits (3).

Frequency divider 10 includes adder 2 and a multiplexer 3 that is electrically coupled to adder 2. Adder 2 has a first input for receiving a first value M and a second input for receiving a least significant bit (LSB) and is operable to generate a second value at the output of the adder that is the sum of the first value M and the LSB. Adder 2 can be synthesized by standard logic cells that calculate MSB+LSB and store the value M+LSB as one of the inputs of multiplexer 3. In the present embodiment, after calculating M+LSB, adder 2 remains idle to reduce power consumption and only recalculates if the divisor changes.

Multiplexer 3 has a first input terminal coupled to receive the first value M (first value) and having a second input terminal electrically coupled to the output of the adder for receiving M+LSB (the second value) and is operable in response to input at a select terminal to alternately output the first value M and the second value M+LSB.

Frequency divider 10 also includes a multi-modulus divider 4 that is electrically coupled to multiplexer 3 for receiving the output of multiplexer 3. Multi-modulus divider 4 includes a clock input for receiving an input clock signal Clk$_{in}$ signal and an input for receiving the complement of the input clock signal. Multi-modulus divider 4 can be a conventional high-speed programmable integer-N divider such as, for example, a simple loadable digital counter that is operable to alternately generate an output pulse at M input clock cycles and at M+LSB cycles of the reference clock signal Clk$_{in}$. Multi-modulus divider 4 does not include complex half-cycle counting circuitry or duty cycle correction circuitry, providing for fast and efficient generation of output pulses having a desired frequency.

Divide-by-two counter 5 has an input coupled to the output of the multi-modulus divider 4 and is operable to divide the output of multi-modulus divider 4 to generate a divided clock signal Clk$_1$ having a frequency of N, where N is equal to 2M+LSB. The output of the divide-by-2 counter is electrically coupled to the select terminal of multiplexer 3 such that multiplexer 3 receives the divided clock signal Clk$_1$ for controlling the operation of multiplexer 3.

The divide-by-two counter 5 serves two purposes, first, its output selects the input of multiplexer 3 to alternate the divisor for multi-modulus-divider 4 and secondly it produces the correct output frequency since 2X(M+LSB/2) =2M+LSB=N.

Duty cycle correction logic 6 is electrically coupled to the output of divide-by-two counter 5 and receives as input the input clock signal, the complement of the input clock signal and the LSB. Duty cycle correction logic 6 is configured to correct the duty cycle of the divided clock signal to a fifty percent duty cycle when N is odd to generate an output clock signal Clk$_{out}$.

Figure 2:
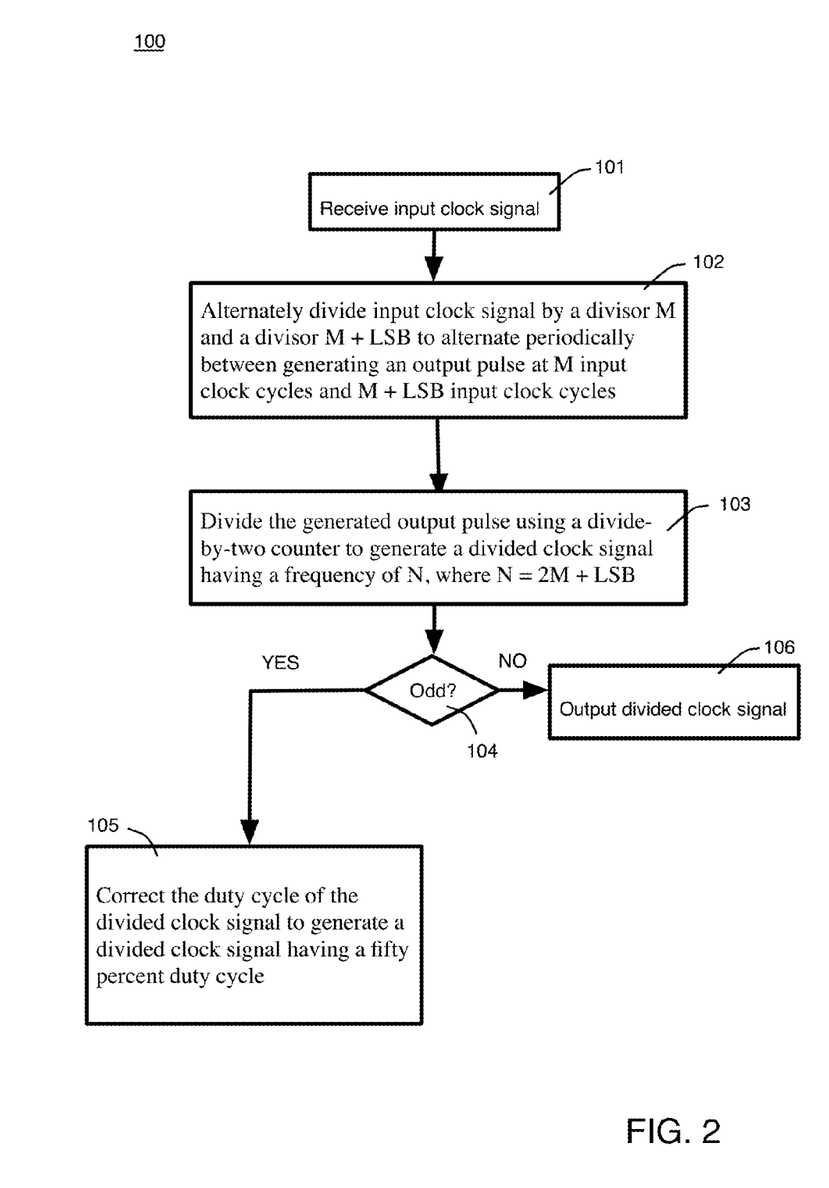
FIG. 2 is a block diagram showing a method for generating a divided clock signal having a 50% duty cycle in accordance with an embodiment of the present invention.

FIG. 2 illustrates a method 100 for generating a divided clock signal having a 50% duty cycle that includes receiving 101 an input clock signal and alternately dividing 102 the input clock signal by a divisor M and a divisor M plus a least significant bit (LSB) to alternate periodically between generating an output pulse at M input clock cycles and M+LSB input clock cycles.

As shown by step 103 the generated output pulse is divided using a divide-by-two counter to generate a divided clock signal having a frequency of N, where N=2M+LSB. In one embodiment the divided clock signal has an output that is high for M+1 cycles and low for M cycles. The duty cycle of the divided clock signal is corrected 104-105 by duty-cycle-correction-logic 6 when the LSB is odd to generate a corrected divided clock signal having a fifty percent duty cycle. When the LSB is even, the divided clock signal is not corrected and becomes the output clock signal as shown by steps 104 and 106.

Figure 3:
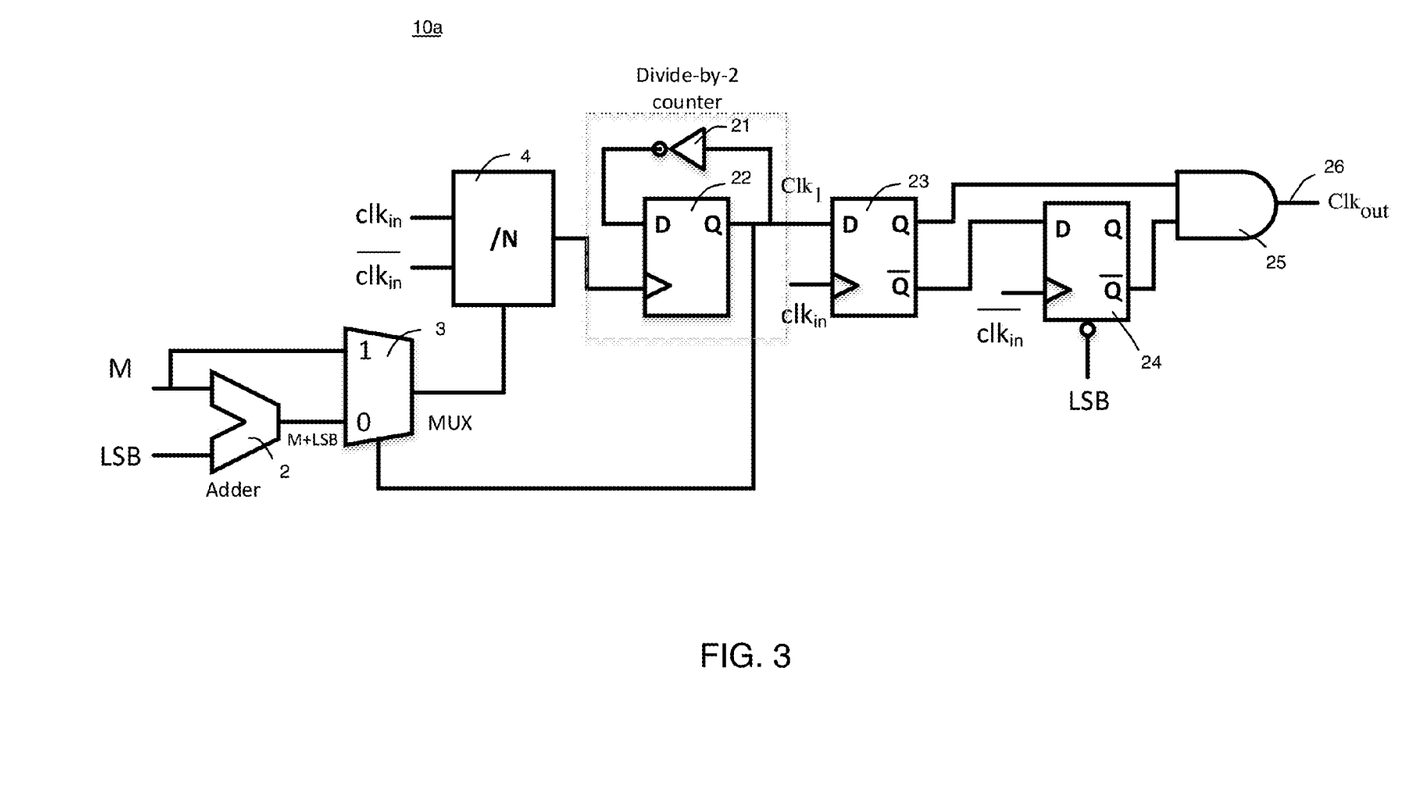
FIG. 3 is an illustration of a frequency divider having duty cycle correction logic that includes an AND gate in accordance with an embodiment of the present invention.

In one embodiment that is illustrated in FIG. 3 a programmable frequency divider 10*a* is shown in which divide-by-two counter 5 further comprises a flip-flop 22 and an inverter 21 coupled to the flip-flop 22. Inverter 21 has an input coupled to receive the divided clock signal Clk$_1$ and has an output coupled to the D input of flip-flop 22. Flip-flop 22 has a clock input coupled to receive the output of the multi-modulus divider 4, the flip-flop 22 operable to generate the divided clock signal Clk$_1$.

In this embodiment, flip-flop 22 will produce a divided clock signal having a 50% duty cycle when N is even and an output having a near-50% duty cycle when N is odd. More particularly, when N is odd the output will have a pulse width that is slightly larger than 50% because the output is high for M+1 input cycles and low for M input cycles.

In this embodiment duty cycle correction logic 6 includes AND gate 25, a first flip-flop 23 and a second flip-flop 24. The output of flip-flop 22 is electrically coupled to the D input of flip-flop 23 and the output of first flip-flop 23 is coupled to a first input of AND gate 25 and a reset terminal of flip-flop 24 is electrically coupled to receive the LSB. The complement of the output of the first flip-flop 23 is coupled to a D input of second flip-flop 24 and the complement of the output of second flip-flop 24 is electrically coupled to the second input of the AND gate 25. Flip-flop 23 is clocked by the input clock signal Clk$_{in}$ and flip-flop 24 is clocked by the complement of the input clock signal such that flip-flops 23-24 are clocked at a half an input period apart from each other.

When N is even, LSB is 0 and both inputs to the multiplexer 3 will be the same such that multi-modulus divider 4 will divide by the same number M each time, producing at the output of divide-by-two counter 5 a divided clock signal having a 50% duty cycle, that will pass through flip-flop 23 after synchronization such that the output of flip-flop 23 becomes Clk$_{out}$.

When N is odd, LSB is 1, flip-flop 23 and flip-flop 24 that can be D-type flip-flops are operable for coupling their outputs that are half of a clock cycle apart from each other to AND gate 25 so as to generate an output clock signal having the desired 50% duty cycle.

Figure 4:
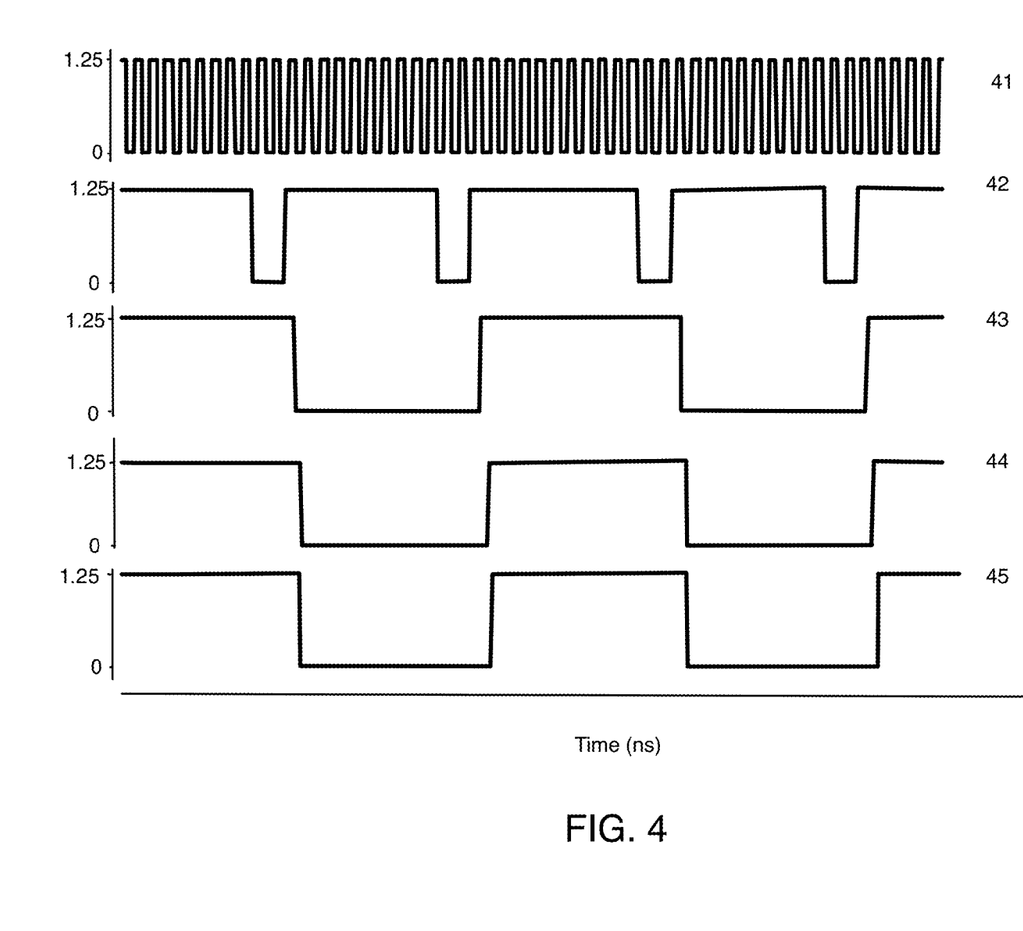
FIG. 4 is a waveform diagram showing signals generated by an embodiment in which N is 25 in accordance with an embodiment of the present invention.

FIG. 4 illustrates an exemplary embodiment in which N=25 and in which an input clock signal (Clk$_{in}$) 41 having a frequency of 2.5 GHz is used to generate at the output of multi-modulus divider 4 an output signal 42 alternately having an output pulse at M input clock cycles and at M+LSB clock cycles. More particularly, multi-modulus divider 4 will divide first by 13, then by 12, followed by 13, etc. Flip-flop 23 generates output Q 43 and flip-flop 24 generates a corresponding output 44 that is coupled to AND gate 25 so as to generate output signal 45 at the output of AND gate 25 having the required 50% duty cycle.

Figure 5:
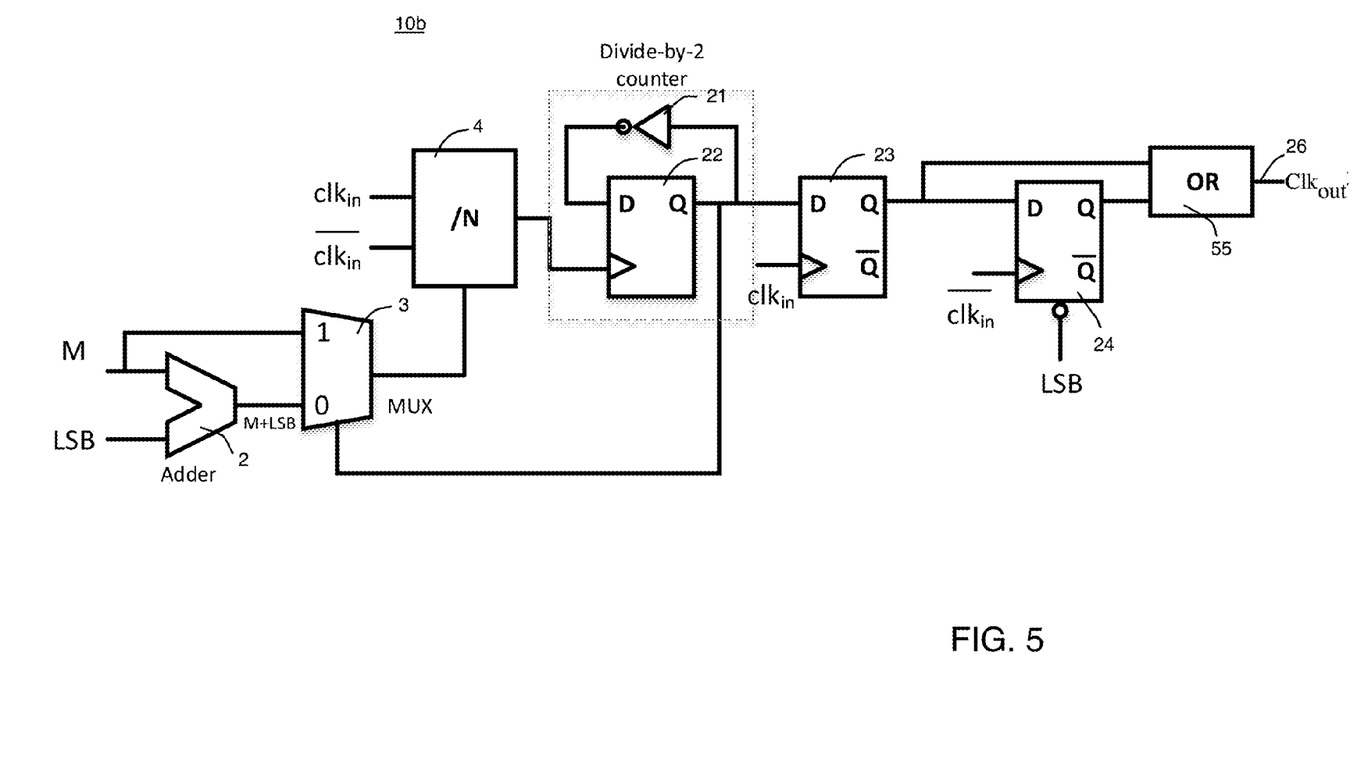
FIG. 5 is an illustration of a frequency divider having duty cycle correction logic that includes an OR gate in accordance with an embodiment of the present invention.

In an alternate embodiment that is shown in FIG. 5 a programmable frequency divider 10*b* is shown that includes an OR gate 55. More particularly, the output of first flip-flop 23 is coupled to a first input of OR gate 55 and to the D-input of second flip-flop 24. The output of second flip-flop 24 is electrically coupled to the second input of the OR gate 55. As in the previous embodiment, flip-flop 23 is clocked by the input clock signal Clk$_{in}$ and flip-flop 24 is clocked by the complement of the input clock signal such that flip-flops 23-24 are clocked at a half an input period apart from each other.

Continuing with FIG. 5, when N is even, LSB is 0 and both inputs to the multiplexer 3 will be the same such that the multi-modulus divider will divide by the same number M each time, producing an output at the divide-by-two counter having a 50% duty that will pass through flip-flop 23 after synchronization such that the output of flip-flop 23 becomes Clk$_{out}$. When N is odd, LSB is 1 and flip-flop 23 and flip-flop 24 are operable to couple their outputs that are half of a clock cycle apart from each other to OR gate 55 so as to generate an output clock signal having the desired 50% duty cycle.

The method and apparatus of the present invention provides a frequency divider having a simplified architecture that does not require counting in half-cycles as do conventional programmable frequency dividers. More particularly, multi-modulus divider 4 and divide-by-two counter 5 operate on full clock cycles, and therefore have a simplified architecture as compared to corresponding structures of frequency dividers that require counting in half cycles.

Accordingly, the frequency divider 10 of the present invention provides for reduced die area and lower power consumption than conventional frequency dividers that require counting in half cycles. Moreover, by not requiring counting in half cycles, the method and apparatus of the present invention allows for higher speed operation.

In the present embodiment, frequency divider 10, 10a, 10b are an Application-Specific Integrated Circuit (ASIC) devices formed on a single semiconductor die. Accordingly, adder 2, multiplexer 3, multi-modulus divider 4, divide-by-two counter 5 and duty cycle correction logic 6 are disposed on a single semiconductor die.

As is known in the art, the methods and apparatus of the present invention may be implemented in a Field Programmable Gate Array (FPGA), an Application-Specific Integrated Circuit (ASIC) or a variety of other commonly known integrated circuit devices. The implementation of the invention may include both hardware and software components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. An integrated circuit device comprising:
   a multiplexer having a first input terminal coupled to receive a first integer value (M) and a second input terminal for receiving a second integer value that is M plus a least significant bit (LSB), the multiplexer configured to alternately output M and the second integer value;
   a multi-modulus divider coupled to the multiplexer for receiving the output of the multiplexer and having a clock input for receiving a clock signal, the multi-modulus divider operable to alternately generate an output pulse at M input clock cycles and at M+LSB clock cycles;
   a divide-by-two counter having an input coupled to the output of the multi-modulus divider, the divide-by-two counter operable to divide the output of the multi-modulus divider to generate a divided clock signal having a frequency equal to 2M+LSB; and
   duty cycle correction logic coupled to the output of the divide by two counter, the duty cycle correction logic configured to correct the duty cycle of the divided clock signal to a fifty percent duty cycle when the LSB is odd.

2. The integrated circuit device of claim 1 further comprising an adder having an output coupled to the multiplexer, a first input for receiving M and a second input for receiving the LSB, the adder operable to add M and the LSB.

3. The integrated circuit device of claim 1 wherein a select terminal of the multiplexer is coupled to the output of the divide-by-two counter for receiving the divided clock signal.

4. The integrated circuit device of claim 3 wherein the divided clock signal has an output that is high for M+1 cycles and low for M cycles when the frequency is odd.

5. The integrated circuit device of claim 3 wherein the divide-by-two counter further comprises a flip-flop and an inverter coupled to the flip flop, the inverter having an input coupled to receive the divided clock signal and having an output coupled to an input of the flip-flop, the flip-flop having a clock input coupled to receive the output of the multi-modulus divider, the flip-flop operable to generate the divided clock signal.

6. The integrated circuit device of claim 3 wherein the duty cycle correction logic further comprises an OR gate, a first flip-flop and a second flip-flop, the first flip-flop coupled to the second flip-flop, wherein the first flip-flop is clocked by the input clock signal and the second flip-flop is clocked by the complement of the input clock signal and further wherein the output of the first flip-flop is coupled to a first input of the OR gate and the output of the second flip-flop is coupled to a second input of the OR gate.

7. The integrated circuit device of claim 3 wherein the duty cycle correction logic further comprises an AND gate, a first flip-flop and a second flip-flop, the first flip-flop coupled to the second flip-flop, wherein the first flip-flop is clocked by the input clock signal and the second flip-flop is clocked by the complement of the input clock signal.

8. The integrated circuit device of claim 7 wherein the output of the first flip-flop is coupled to a first input of the AND gate and the complement of the output of the first flip-flop is coupled to an input of the second flip-flop, and wherein the complement of the output of the second flip-flop is coupled to the second input of the AND gate.

9. A method comprising:
   alternately dividing an input clock signal by a first divisor having a first integer value (M) M and a second divisor having a value of M plus a least significant bit (LSB) to alternate periodically between generating an output pulse at M input clock cycles and M+LSB input clock cycles;
   dividing the generated output pulse using a divide-by-two counter to generate a divided clock signal having a frequency equal to 2M+LSB; and
   correcting the duty cycle of the divided clock signal when the LSB is odd to generate a corrected divided clock signal having a fifty percent duty cycle.

10. The method of claim 9 wherein the divided clock signal has an output that is high for M+1 cycles and low for M cycles when the LSB is odd.

11. The method of claim 9 wherein the correcting the duty cycle further comprises correcting the duty cycle using duty cycle correction logic that includes a first flip-flop and a second flip-flop that are clocked at half of a clock cycle apart from each other, and that includes an AND gate coupled to the output of the first flip-flop and to the complement of the output of the second flip-flop.

12. A frequency divider comprising:
   an adder having a first input for receiving a first integer value (M) and a second input for receiving a least significant bit (LSB), the adder operable to generate a second integer value at the output of the adder that is the sum of M and the LSB;
   a multiplexer having a first input terminal coupled to receive M and having a second input terminal electrically coupled to the output of the adder for receiving the second integer value, the multiplexer configured to alternately output M and the second integer value;
   a multi-modulus divider coupled to the multiplexer for receiving the output of the multiplexer and having a clock input for receiving a clock signal, the multi-modulus divider operable to alternately generate an output pulse at M input clock cycles and at M+LSB clock cycles;

a divide-by-two counter having an input coupled to the output of the multi-modulus divider, the divide-by-two counter operable to divide the output of the multi-modulus divider to generate a divided clock signal having a frequency equal to 2M+LSB; and duty cycle correction logic coupled to the output of the divide by two counter, the duty cycle correction logic configured to correct the duty cycle of the divided clock signal to a fifty percent duty cycle when the LSB is odd.

13. The frequency divider of claim 12 wherein a select terminal of the multiplexer is coupled to the output of the divide-by-two counter for controlling the operation of the multiplexer.

14. The frequency divider of claim 12 wherein the divided clock signal has an output that is high for M+1 cycles and low for M cycles when the LSB is odd.

15. The frequency divider of claim 12 wherein the divide-by-two counter further comprises a flip-flop and an inverter coupled to the flip flop, the inverter having an input coupled to receive the divided clock signal and having an output coupled to an input of the flip-flop, the flip-flop having a clock input coupled to receive the output of the multi-modulus divider, the flip-flop operable to generate the divided clock signal.

16. The frequency divider of claim 12 wherein the duty cycle correction logic further comprises an OR gate, a first flip-flop and a second flip-flop, the first flip-flop coupled to the second flip-flop, wherein the first flip-flop is clocked by the input clock signal and the second flip-flop is clocked by the complement of the input clock signal and further wherein the output of the first flip-flop is coupled to a first input of the OR gate and the output of the second flip-flop is coupled to a second input of the OR gate.

17. The frequency divider of claim 12 wherein the duty cycle correction logic further comprises an AND gate, a first flip-flop and a second flip-flop, the first flip-flop coupled to the second flip-flop, wherein the first flip-flop is clocked by the input clock signal and the second flip-flop is clocked by the complement of the input clock signal.

18. The frequency divider of claim 17 wherein the output of the first flip-flop is coupled to a first input of the AND gate and the complement of the output of the first flip-flop is coupled to an input of the second flip-flop, and wherein the complement of the output of the second flip-flop is coupled to the second input of the AND gate.

* * * * *